(12) United States Patent
Zhu et al.

(10) Patent No.: US 11,898,932 B2
(45) Date of Patent: Feb. 13, 2024

(54) MOTOR BEARING FAILURE DIAGNOSIS DEVICE (71) Applicant: ZHUZHOU CRRC TIMES ELECTRIC CO., LTD., Hunan (CN)

(72) Inventors: Wenlong Zhu, Hunan (CN); Yong Liu, Hunan (CN); Jisheng Dai, Hunan (CN); Zongshuai Li, Hunan (CN); Jiawei Yang, Hunan (CN); Ping Jiang, Hunan (CN); Yanhao Zhan, Hunan (CN); Zhongjing Zhang, Hunan (CN); Hailong Xu, Hunan (CN)

(73) Assignee: ZHUZHOU CRRC TIMES ELECTRIC CO., LTD., Hunan (CN)

( * ) Notice: Subject to any disclaimer, the term of this patent is extended or adjusted under 35 U.S.C. 154(b) by 452 days.

(21) Appl. No.: 17/261,886

(22) PCT Filed: Sep. 3, 2019

(86) PCT No.: PCT/CN2019/104202
§ 371 (c)(1),
(2) Date: Jan. 21, 2021

(87) PCT Pub. No.: WO2020/078132
PCT Pub. Date: Apr. 23, 2020

(65) Prior Publication Data
US 2021/0286995 A1 Sep. 16, 2021

(30) Foreign Application Priority Data
Oct. 15, 2018 (CN) .......................... 201811197298.4

(51) Int. Cl.
*G01R 19/00* (2006.01)
*G01M 13/045* (2019.01)
(Continued)

(52) U.S. Cl.
CPC ....... *G01M 13/045* (2013.01); *G01R 19/0092* (2013.01); *G01R 23/16* (2013.01);
(Continued)

(58) Field of Classification Search
CPC . G01M 13/045; G01R 19/0092; G01R 23/16; G06F 2218/12; G06F 2218/10; G06F 2218/02
See application file for complete search history.

(56) References Cited

U.S. PATENT DOCUMENTS

| 6,199,023 B1 | 3/2001 | Kliman |
| 2005/0007096 A1 | 1/2005 | Dimino et al. |

(Continued)

FOREIGN PATENT DOCUMENTS

| CN | 101034038 A | 9/2007 |
| CN | 103033745 A | 4/2013 |

(Continued)

OTHER PUBLICATIONS

The European Search Report dated Mar. 3, 2022 for EP19872841.2.
(Continued)

*Primary Examiner* — Dominic E Hawkins
(74) *Attorney, Agent, or Firm* — Yue (Robert) Xu; Apex Attorneys at Law, LLP (57) ABSTRACT

A device for diagnosing a fault in a bearing of a motor is provided. If the device operates in a fault diagnosis mode, a current signal acquisition unit acquires a real-time current signal of the motor, a residual signal acquisition unit extracts harmonic signals from the real-time current signal of the motor acquired by the current signal acquisition unit and remove a fundamental signal and a harmonic signal from the real-time current signal of the motor to acquire a residual signal, a fault feature extraction unit analyzes the residual signal in both time domain and frequency domain to extract
(Continued)

a fault feature index of the bearing, and a fault diagnosis model unit performs, by using a bearing fault diagnosis model obtained through training, pattern recognition on the fault feature index to diagnose a fault state of the bearing.

9 Claims, 3 Drawing Sheets

(51) Int. Cl.
    *G01R 23/16*     (2006.01)
    *G01R 31/34*     (2020.01)
    *G06F 18/214*     (2023.01)

(52) U.S. Cl.
    CPC ......... *G01R 31/34* (2013.01); *G06F 18/2148* (2023.01); *G06F 2218/02* (2023.01); *G06F 2218/10* (2023.01); *G06F 2218/12* (2023.01)

(56) References Cited

U.S. PATENT DOCUMENTS

| | | | |
|---|---|---|---|
| 2009/0146599 A1* | 6/2009 | Zhou | G01R 31/343 318/490 |
| 2013/0049733 A1 | 2/2013 | Neti et al. | |
| 2019/0310164 A1* | 10/2019 | Chen | G01N 33/2835 |

FOREIGN PATENT DOCUMENTS

| | | |
|---|---|---|
| CN | 105929331 A | 9/2016 |
| CN | 106769041 A | 5/2017 |
| CN | 108303249 A | 7/2018 |
| CN | 109061474 A | 12/2018 |
| CN | 109238698 A | 1/2019 |
| EP | 1489475 A2 | 12/2004 |
| JP | 2015129523 A | 7/2015 |

OTHER PUBLICATIONS

International Search Report for PCT/CN2019/104202 dated Dec. 3, 2019, ISA/CN.

Li Huaijun, Research on fault feature extraction method of Gear Transmission system common feature analysis method, Southwest Jiaotong University Press, Jul. 31, 2016.

Zhang Haigang, Online approach for bearing fault detection in induction motor using stator current monitoring, pp. 514-519, Apr. 30, 2015 vol. 32 No. 4 Control Theory & Applications.

* cited by examiner

MOTOR BEARING FAILURE DIAGNOSIS DEVICE

The present application is a national phase application of PCT international patent application PCT/CN2019/104202, filed on Sep. 3, 2019 which claims priority to Chinese Patent Application No. 201811197298.4, titled "MOTOR BEARING FAILURE DIAGNOSIS DEVICE", filed on Oct. 15, 2018 with the China National Intellectual Property Administration, both of which are incorporated herein by reference in their entireties.

FIELD

The present disclosure relates to the technical field of fault detection, and in particular to a device for diagnosing a fault in a bearing of a traction motor based on a current signal.

BACKGROUND

In electrical railway vehicles, a traction motor is a core component for converting electrical energy into mechanical energy. The traction motor bears an important task of power output during operation of the electrical railway vehicle, and has an important impact on operation efficiency and security of the electrical railway vehicle. Operation practices show that faults in a bearing of the motor are the most common and dangerous faults in the traction motor. Occurrence and development of these faults damage not only the motor, but also other devices, resulting in great losses. How to timely and effectively monitor and diagnose a fault state in the bearing of the traction motor so as to avoid severe accidents and an economic loss caused by an unnecessary shutdown is a key technical problem in maintenance of the traction motor.

At present, a vibration signal analysis method and a stator current signal analysis method are widely used to diagnose a fault in the bearing of the traction motor. In the vibration signal analysis method, an additional device such as a vibration sensor is required, not only increasing cost but also resulting in new security risks. The stator current signal analysis method is a non-invasive fault diagnosis method which requires no additional sensor, and has advantages of low cost and easy implementation. However, affected by a pulse width modulation (PWM) power supply as well as complex and changeable operation conditions, a current signal of the traction motor includes abundant information about the operation state of the motor, and a fault feature signal of the bearing is relatively weak and always mixed in an interference signal such as a harmonics signal. It is difficult to effectively extract the fault feature signal from a current signal with a low signal-to-noise ratio by using a conventional motor current signal analysis (MCSA) algorithm, such as fast Fourier transformation (FFT) and PARK vector mode analysis, resulting in misdiagnosis or missed diagnosis.

In the conventional technology, the following technical solutions are related to technical solutions of the present disclosure.

Chinese patent application with the publication number of CN106769041A, titled "DEVICE AND METHOD FOR ONLINE DIAGNOSING FAULT IN BEARING OF PERMANENT MAGNET SYNCHRONOUS MOTOR UNDER VARIABLE SPEED CONDITIONS", filed by Anhui University on Dec. 23, 2016, and published on May 31, 2017, discloses a device and a method for online diagnosing a fault in a bearing of a permanent magnet synchronous motor under variable speed conditions. An analog-to-digital converter 1 is connected to a current probe, and is configured to collect a current signal at equal time intervals. A microcontroller 1 is configured to perform low-pass filtering and polarity conversion on the current signal. An angle of a converted unipolar current signal is calculated and the angle is rounded. The microcontroller 1 generates a trigger signal every time the angle changes by 1 degree. A microcontroller 2 is configured to receive the trigger signal generated by the microcontroller 1, and control an analog-to-digital converter 2 to trigger a microphone to sample a signal of the microphone, so as to acquire a sound signal of the bearing. Envelope demodulation is performed on the signal of the bearing in angular domain. An order spectrum of the envelope signal is calculated. A type of the fault in the bearing is determined based on an order of the fault feature, and is displayed on a display screen. In this application, the sound signal of the bearing is analyzed and processed, and the type of the fault in the bearing is determined based on the order of the fault feature. Additional components such as a sensor and an analog-to-digital converter are required, which is not conducive to cost reduction. Further, it is difficult to effectively extract the fault feature signal from the current signal with low signal-to-noise ratio by determining the type of the fault in the bearing based on the sound signal of the bearing.

Chinese patent application with the publication number of CN106989923A, titled "METHOD FOR DETECTING PITTING CORROSION FAULT IN BEARING OF PERMANENT MAGNET MACHINE BASED ON WAVELET PACKET ANALYSIS OF STATOR CURRENT", filed by Nanjing University of Aeronautics and Astronautics on Mar. 28, 2017, and published on Jul. 28, 2017, discloses a method for detecting a pitting corrosion fault in a bearing of a permanent magnet motor based on wavelet packet analysis of a stator current. The stator current of the permanent magnet machine is used for fault diagnosis. Signal analysis of the stator current is performed by using a wavelet packet analysis method. The wavelet packet analysis is a multi-resolution analysis method in which a signal is decomposed based on frequency bands. After a frequency of the fault in the motor is determined, a wavelet packet node corresponding to the frequency of the fault in the motor is calculated. A root mean square of a coefficient of the wavelet packet node is calculated. A type of the fault is determined based on the root mean square. In this application, the signal analysis of the stator current is performed by using the wavelet packet analysis method, and the type of the fault is determined based on the root mean square of the coefficient of the wavelet packet node. There is also a technical problem in this application that it is difficult to effectively extract a fault feature signal from a current signal with low signal-to-noise ratio.

Chinese patent application with the publication number of CN106680716A, titled "METHOD FOR DIAGNOSING FAULT IN BEARING OF PERMANENT MAGNET MOTOR BASED ON POSITION-LESS SENSOR", filed by Zhejiang University on Jan. 20, 2017 and published on May 17, 2017, discloses a method for diagnosing a fault in a bearing of a permanent magnet motor based on a position-less sensor. First, a voltage and a current are acquired from a control chip of the motor, and a position angle and a rotation speed of a rotor of the motor are acquired by using a position-less sensor algorithm. Then, an alternating current component in the rotation speed is extracted by a moving average filter, and is resampled in angular domain based on the position angle. Finally, the resampled speed signal is analyzed in frequency domain, and whether the bearing has a fault is determined based on information in the frequency domain. In this application, the position angle and the rotation speed of the rotor of the motor are acquired based on the voltage and the current by using the position-less sensor algorithm, and the alternating current component in the rotation speed is resampled in the angular domain based on the position angle. The algorithm is complicated. Further, there is also a technical problem that it is difficult to effectively extract a fault feature signal from a current signal with a low signal-to-noise ratio.

SUMMARY

In view of this, a device for diagnosing a fault in a bearing of a motor is provided according to the present disclosure, so as to solve a technical problem that, it is difficult for the conventional device for diagnosing a fault in a bearing of a motor to effectively extract a fault feature signal from a current signal with a low signal-to-noise ratio, thereby resulting in misdiagnosis or missed diagnosis.

To solve the above technical problem, a device for diagnosing a fault in a bearing of a motor is provided according to the present disclosure. The device for diagnosing a fault in a bearing of a motor includes: a current signal acquisition unit, a residual signal acquisition unit, a fault feature extraction unit and a fault diagnosis model unit. In a case that the device operates in a fault diagnosis mode, the current signal acquisition unit is configured to acquire a real-time current signal of the motor;

the residual signal acquisition unit is configured to extract harmonic signals from the real-time current signal of the motor acquired by the current signal acquisition unit (1), and remove a fundamental signal and a harmonic signal from the real-time current signal of the motor, to acquire a residual signal;

the fault feature extraction unit is configured to analyze the residual signal acquired by the residual signal acquisition unit in both time domain and frequency domain, to extract a fault feature index of the bearing; and the fault diagnosis model unit is configured to perform, by using a bearing fault diagnosis model obtained through training, pattern recognition on the fault feature index of the bearing extracted by the fault feature extraction unit, to diagnose a fault state of the bearing.

In an embodiment, in the case that the device operates in the fault diagnosis mode, the fault feature extraction unit is configured to: acquire a minimum value $I\_min$ and an effective value $I\_rms$) of the residual signal, acquire a fault feature frequency of the bearing, and acquire a fault feature frequency sequence of the bearing, wherein FFT transformation is performed on the residual signal to acquire a frequency spectrum of the residual signal, and acquire an amplitude of the fault feature frequency sequence of the bearing based on the frequency spectrum of the residual signal; and acquire a minimum value $I\_min$ and an effective value $I\_rms$ of the residual signal, and acquire a maximum value $I\_f\_max$, a peak-to-peak value $I\_f\_peark$ and a crest factor $I\_f\_crest$ of the amplitude $I\_f(n)$ of the fault feature frequency sequence of the bearing based on the amplitude of the fault feature frequency sequence of the bearing.

In an embodiment, in a case that the device operates in a fault model training mode, the current signal acquisition unit is configured to acquire multiple history current signals of the motor in different fault states of the bearing, as a training sample data set for the bearing fault diagnosis model;

the residual signal acquisition unit is configured to, for each of the multiple history current signals of the motor in the training sample data set acquired by the current signal acquisition unit, extract harmonic signals from the history current signal of the motor, and remove a fundamental signal and a harmonic signal from the history current signal of the motor, to acquire a residual signal;

the fault feature extraction unit is configured to analyze the residual signal acquired by the residual signal acquisition unit in both time domain and frequency domain, to extract a fault feature index of the bearing; and the fault diagnosis model unit is configured to perform training based on the fault feature index of the bearing extracted by the fault feature extraction unit and fault types of the bearing, to acquire the bearing fault diagnosis model.

In an embodiment, the residual signal acquisition unit is configured to: in a case that the device operates in the fault model training mode, for each of the multiple history current signals, acquire amplitudes, initial phases and frequencies of the fundamental signal and the harmonic signal of the history current signal of the motor from the history current signal of the motor, to acquire the fundamental signal and the harmonic signal, and remove the fundamental signal and the harmonic signal from the history current signal of the motor, to acquire the residual signal.

In an embodiment, the residual signal acquisition unit is configured to: in the case that the device operates in the fault diagnosis mode, acquire amplitudes, initial phases and frequencies of the fundamental signal and the harmonic signal of the real-time current signal of the motor that is to be diagnosed from the real-time current signal of the motor, to acquire the fundamental signal and the harmonic signal, and remove the fundamental signal and the harmonic signal from the real-time current signal of the motor to acquire the residual signal.

In an embodiment, in the case that the device operates in the fault model training mode, the fault feature extraction unit is configured to: acquire a minimum value $I\_min$ and an effective value $I\_rms$ of the residual signal, acquire the fault feature frequency of the bearing, and acquire the fault feature frequency sequence of the bearing, wherein FFT transformation is performed on the residual signal to acquire the frequency spectrum of the residual signal, and acquire the amplitude of the fault feature frequency sequence of the bearing based on the frequency spectrum of the residual signal; and acquire the minimum value $I\_min$ and the effective value $I\_rms$ of the residual signal, and acquire the maximum value $I\_f\_max$, the peak-to-peak value $I\_f\_peark$ and the crest factor $I\_f\_crest$ of the amplitude $I\_f(n)$ of the fault feature frequency sequence of the bearing based on the amplitude of the fault feature frequency sequence of the bearing.

In an embodiment, the residual signal acquisition unit is configured to: in the case that the device operates in the fault model training mode and for each of the multiple history current signals, acquire amplitudes, initial phases and frequencies of the fundamental signal and the harmonic signal of the history current signal of the motor by using a full-phase time-shift phase difference correction algorithm, to acquire the fundamental signal and the harmonic signal; and in the case that the device operates in the fault diagnosis mode, acquire amplitudes, initial phases and frequencies of the fundamental signal and the harmonic signal of the real-time current signal of the motor by using a full-phase time-shift phase difference correction algorithm, to acquire the fundamental signal and the harmonic signal.

In an embodiment, the fault diagnosis model unit is configured to: in the case that the device operates in the fault model training mode, performing training based on the extracted fault feature index of the bearing and fault types of the bearing by using a gradient boosting tree classifier, to acquire the bearing fault diagnosis model; and in the case that the device operates in the fault diagnosis mode, perform, by using the bearing fault diagnosis model based on a gradient boosting tree that is obtained by training, pattern recognition on the extracted fault feature index of the bearing, to diagnose the fault state of the bearing.

In an embodiment, the fault feature frequency sequence $f(k)$ of the bearing is expressed as $|fe \pm kfv|$, k=1, 2, 3, where $fe$ represents a fundamental signal frequency of the residual signal, and $fv$ represents the fault feature frequency of the bearing.

In an embodiment, the fault feature extraction unit is configured to:
acquire the minimum value I_min of the residual signal from following equation:

I_min=min(I(t)), where I(t) represents a time series of the residual signal, t=1~N, and N represents the number of sampling points of the residual signal;
acquire the effective value I_rms of the residual signal from following equation:

$$I\_rms = \sqrt{\frac{1}{N-1}\left(\sum_{t=1}^{N} I^2(t)\right)};$$

acquire the maximum value of the amplitude the fault feature frequency sequence of the bearing from following equation:

I_f_max=max(I_f(n)), where I_f(n) represents the amplitude of the fault feature frequency sequence of the bearing;
acquire the peak-to-peak value of the amplitude of the fault feature frequency sequence of the bearing from following equation:

I_f_peark=I_f_max−I_min; and acquire the crest factor of the amplitude of the fault feature frequency sequence of the bearing from following equation:

I_f_crest=I_f_max/I_rms

In an embodiment, the fault state of the bearing includes a fault in a holder of the bearing, a fault in an outer ring of the bearing, a fault in an inner ring of the bearing and a fault in a rolling element of the bearing, and the fault feature extraction unit is configured to:
acquire a fault feature frequency of the holder of the bearing from following equation:

$$\frac{1}{2}f_r\left(1 - \frac{D_B\cos\theta}{D_P}\right);$$

acquire a fault feature frequency of the outer ring of the bearing from following equation:

$$\frac{N_B}{2}f_r\left(1 - \frac{D_B\cos\theta}{D_P}\right);$$

acquire a of a fault feature frequency of the inner ring of the bearing from following equation:

$$\frac{N_B}{2}f_r\left(1 + \frac{D_B\cos\theta}{D_P}\right); \text{ and}$$

acquire a fault feature frequency of the rolling element of the bearing from following equation:

$$\frac{D_P}{D_B}f_r\left(1 - \left(\frac{D_B\cos\theta}{D_P}\right)^2\right),$$

where fr represents a rotation frequency of the motor, $D_B$ represents a diameter of the rolling element of the bearing, $D_P$ represents a diameter of a bearing section, $N_B$ represents the number of rolling elements in the bearing, and θ represents a contact angle.

The device for diagnosing a fault in a bearing of a motor according to the present disclosure has the following beneficial effects.

(1) In the present disclosure, the harmonic signals are extracted from the current signal of the motor, and the fundamental signal and the harmonic signal are removed from the history current signal of the motor, to acquire the residual signal, such that interference of a harmonic signal resulted from PWM (short for pulse width modulation) power supply on the fault feature signal of the bearing can be effectively reduced, thereby improving a signal-to-noise ratio of the current signal. Therefore, the extracted fault feature index is significant.

(2) In the present disclosure, a change in the fault feature index of the bearing extracted from the residual signal reflects a change in a health state of the bearing of the traction motor. The fault feature index can accurately characterize the state of the fault in the bearing. The harmonic signals in the current signal is extracted and removed by using the full-phase time-shift phase difference correction algorithm, thereby further enhancing significance of the fault feature index.

(3) In the present disclosure, the state of the fault in the bearing can be automatically recognized by using the fault diagnosis model based on a gradient boosting tree. It is unnecessary for an expert to observe a spectrogram to diagnose the fault state of the bearing. Whether the bearing is faulty or not can be automatically recognized based on a feature of the current signal of the motor, thereby effectively reducing interference of a human subjective factor, and improving objectivity and accuracy of fault diagnosis.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. It is apparent that the drawings in the following description show only some embodiments of the present disclosure, and other drawings may be acquired by those skilled in the art from the drawings without any creative work.

1 - Current signal acquisition unit,
2 - Residual signal calculation unit,
3 - Fault feature extraction unit,
4 - Fault diagnosis model unit.

DETAILED DESCRIPTION OF THE EMBODIMENTS

For the sake of reference and clarity, technical terms, acronyms or abbreviations used in the following description are described as follows.

An all-phase time-shift phase difference correction algorithm is an algorithm for eliminating interference of a sinusoidal signal in a signal, and is used to acquire amplitudes, frequencies and initial phases of a fundamental signal and a harmonic signal.

A gradient boosting tree is a machine learning algorithm, which is a member of a Boosting family of integrated learning, and is used to update a weight of a training set by using an error rate of a previous iterative weak learner.

In order to make objects, technical solutions, and advantages of embodiments of the present disclosure clearer, the technical solutions in the embodiments of the present disclosure are described clearly and completely in conjunction with the drawings in the embodiments of the present disclosure hereinafter. It is apparent that the described embodiments are only some rather than all embodiments of the present disclosure. All other embodiments acquired by those skilled in the art based on the embodiments of the present disclosure without any creative work fall within the protection scope of the present disclosure.

FIGS. 1 to 5 show embodiments of a device for diagnosing a fault in a bearing of a motor and a method for diagnosing a fault in a bearing of a motor performed by the device according to the present disclosure. The present disclosure is further described below in conjunction with the drawings and the embodiments.

First Embodiment

Figure 1:
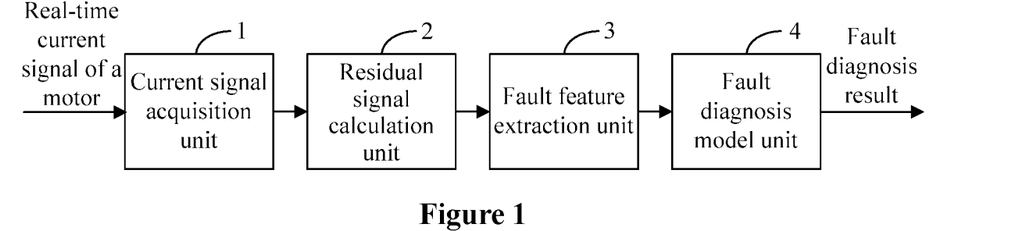
FIG. 1 is a block diagram showing an operation principle of a device for diagnosing a fault in a bearing of a motor operating in a fault diagnosis mode according to an embodiment of the present disclosure.

As shown in FIG. 1, a device for diagnosing a fault in a bearing of a motor based on a current signal includes: a current signal acquisition unit 1, a residual signal acquisition unit 2, a fault feature extraction unit 3, and a fault diagnosis model unit 4.

In a case that the device operates in a fault diagnosis mode, the current signal acquisition unit 1 is configured to acquire a real-time current signal of the motor, the residual signal acquisition unit 2 is configured to extract harmonic signals from the real-time current signal of the motor acquired by the current signal acquisition unit 1, and remove a fundamental signal and a harmonic signal from the real-time current signal of the motor, to acquire a residual signal, the fault feature extraction unit 3 is configured to analyze the residual signal acquired by the residual signal acquisition unit 2 in both time domain and frequency domain, to extract a fault feature index of the bearing, and the fault diagnosis model unit 4 is configured to perform, by using a trained bearing fault diagnosis model, pattern recognition on the fault feature index (vector) of the bearing extracted by the fault feature extraction unit 3, to diagnose a fault state of the bearing (that is, a type of the fault in the bearing).

In a preferred embodiment of the present disclosure, the fault diagnosis model unit 4 inputs the extracted fault feature index (vector) of the bearing into a trained bearing fault diagnosis model based on a gradient boosting tree (which is an existing algorithm in the conventional technology and thus is not described in detail herein), to perform pattern recognition, to diagnose the fault state of the bearing.

In the case that the device operates in the fault diagnosis mode, the residual signal acquisition unit 2 acquires amplitudes, initial phases and frequencies of a fundamental signal $fe$ and a harmonic signal $n*fe$, , n=2, 3, 4, . . . , 50 of the real-time current signal of the motor that is to be diagnosed from the real-time current signal of the motor, to acquire the fundamental signal and the harmonic signal, and removes the fundamental signal and the harmonic signal from the real-time current signal of the motor, to acquire the residual signal.

Figure 2:
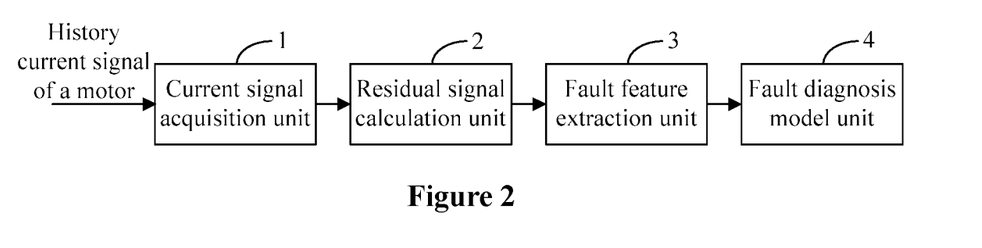
FIG. 2 is a block diagram showing an operation principle of a device for diagnosing a fault in a bearing of a motor operating in a model training mode according to an embodiment of the present disclosure.

As shown in FIG. 2, in the case that the device operates in the fault diagnosis mode, the fault feature extraction unit 3 acquires a minimum value I_min and an effective value I_rms of the residual signal, acquires a fault feature frequency of the bearing, and acquires a fault feature frequency sequence of the bearing, where FFT transformation (short for Fast Fourier Transformation) is performed on the residual signal to acquire a frequency spectrum of the residual signal, and acquire an amplitude of the fault feature frequency sequence of the bearing based on the frequency spectrum of the residual signal; and acquires a maximum value I_$f$ _max, a peak-to-peak value I_$f$ _peark and a crest factor I_$f$ _crest of an amplitude I_$f$ (n) of the fault feature frequency sequence of the bearing based on the amplitude of the fault feature frequency sequence of the bearing.

The fault diagnosis model unit 4 performs, by using a trained bearing fault diagnosis model, pattern recognition on the fault feature index (vector) of the bearing that is extracted by the fault feature extraction unit 3. The fault feature index (vector) of the bearing includes the amplitude I_$f$ (n) of the fault feature frequency sequence of the bearing, the maximum value I_$f$ _max, the peak-to-peak value I_$f$ _peark and the crest factor I_$f$ _crest of the amplitude of the fault feature frequency sequence of the bearing, and the minimum value I_min and the effective value I_rms of the residual signal, to diagnose the fault state of the bearing.

In a case that the device operates in a fault model training mode:

the current signal acquisition unit 1 is configured to acquire multiple history current signals of the motor in different fault states of the bearing (corresponding to different types of faults of the bearing), as a training sample data set for the bearing fault diagnosis model;

the residual signal acquisition unit 2 is configured to, for each of the multiple history current signals of the motor in the training sample data set acquired by the current signal acquisition unit 1, extract harmonic signals from the history current signal of the motor, and remove a fundamental signal and a harmonic signal from the history current signal of the motor, to acquire a residual signal;

the fault feature extraction unit 3 is configured to analyze the residual signal acquired by the residual signal acquisition unit 2 in both time domain and frequency domain, to extract a fault feature index of the bearing; and the fault diagnosis model unit 4 is configured to perform training based on the fault feature index (vector) of the bearing extracted by the fault feature extraction unit 3 and fault types of the bearing, to acquire the bearing fault diagnosis model.

In a preferred embodiment of the present disclosure, the fault diagnosis model unit 4 inputs the extracted fault feature index (vector) of the bearing and the fault types of the bearing into the gradient boosting tree classifier (which is an existing algorithm in the conventional technology and thus is not described in detail herein), to perform training based on the fault feature index (vector) of the bearing and the fault types of the bearing, to acquire the bearing fault diagnosis model.

In the case that the device operates in the fault model training mode, the residual signal acquisition unit 2 acquires amplitudes, initial phases and frequencies of the fundamental signal $fe$ and the harmonic signal $n*fe$,, n=2, 3, 4, . . . , 50 of the history current signal of the motor from the history current signal of the motor by using a full-phase time-shift phase difference correction algorithm, to acquire the fundamental signal and the harmonic signal, and removes the fundamental signal and the harmonic signal from the history current signal of the motor, to acquire the residual signal.

In a case that the device operates in the fault model training mode, the fault feature extraction unit 3 acquires the minimum value I_min and the effective value I_rms of the residual signal, acquires a fault feature frequency of the bearing, and acquires a fault feature frequency sequence of the bearing. The fault feature frequency sequence $f(k)$ of the bearing is expressed as $|fe \pm kfv|$, k=1, 2, 3, . . . , n, where n is the order of the harmonic signal, and may be greater than or equal to 3, and smaller than or equal to 5, $fe$ represents a fundamental signal frequency of the residual signal, and $fv$ represents the fault feature frequency of the bearing. The fault feature extraction unit 3 performs FFT transformation on the residual signal to acquire a frequency spectrum of the residual signal, and acquires an amplitude of the fault feature frequency sequence of the bearing (that is, finds an amplitude of the residual signal at each frequency $f(k)$,, where the frequency $f(k)$ is identical to a frequency in the frequency spectrum of the residual signal) based on the frequency spectrum of the residual signal; and acquires the maximum value I_$f$_max, the peak-to-peak value I_$f$_peark and the crest factor I_$f$_crest of the amplitude (I_$f$ (n)) of the fault feature frequency sequence of the bearing based on the amplitude of the fault feature frequency sequence of the bearing.

The fault diagnosis model unit 4 performs training based on the fault types of the bearing and the fault feature index (vector) of the bearing extracted by the fault feature extraction unit 3 in different fault states of the bearing. The fault feature index (vector) of the bearing includes the amplitude I_$f$ (n) of the fault feature frequency sequence of the bearing, the maximum value I_$f$_max, the peak-to-peak value I_$f$_peark and the crest factor I_$f$_crest of the amplitude of the fault feature frequency sequence of the bearing, and the minimum value I_min and the effective value I_rms of the residual signal, to acquire the bearing fault diagnosis model.

The fault feature extraction unit 3 acquires the minimum value I_min of the residual signal from the following equation:

I_min=min(I(t)), where I(t) represents a time series of the residual signal, t=1~N, and N represents the number of sampling points of the signal.

The fault feature extraction unit 3 acquires the effective value I_rms of the residual signal from the following equation:

$$\text{I\_rms} = \sqrt{\frac{1}{N-1}\left(\sum_{t=1}^{N} I^2(t)\right)}.$$

The fault feature extraction unit 3 acquires the maximum value of the amplitude of the fault feature frequency sequence of the bearing from the following equation:

I_$f$_max=max(I_$f$ (n)), where I_$f$ (n) represents the amplitude of the fault feature frequency sequence of the bearing.

The fault feature extraction unit 3 acquires the peak-to-peak value of the amplitude of the fault feature frequency sequence of the bearing from the following equation:

I_$f$_peark=I_$f$_max−I_min.

The fault feature extraction unit 3 acquires the crest factor of the amplitude of the fault feature frequency sequence of the bearing from the following equation:

I_$f$_crest=I_$f$_max/I_rms

The fault state of the bearing includes a fault in a holder of the bearing, a fault in an outer ring of the bearing, a fault in an inner ring of the bearing and a fault in a rolling element of the bearing.

The fault feature extraction unit 3 acquires a fault feature frequency of the holder of the bearing from the following equation:

$$\frac{1}{2}f_r\left(1 - \frac{D_B\cos\theta}{D_P}\right).$$

The fault feature extraction unit 3 acquires a fault feature frequency of the outer ring of the bearing from the following equation:

$$\frac{N_B}{2} f_r \left(1 - \frac{D_B \cos\theta}{D_P}\right).$$

The fault feature extraction unit 3 acquires a fault feature frequency of the inner ring of the bearing from the following equation:

$$\frac{N_B}{2} f_r \left(1 + \frac{D_B \cos\theta}{D_P}\right).$$

The fault feature extraction unit 3 acquires a fault feature frequency of the rolling element of the bearing from the following equation:

$$\frac{D_P}{D_B} f_r \left(1 - \left(\frac{D_B \cos\theta}{D_P}\right)^2\right).$$

In the above equations, $fr$ represents a rotation frequency of the motor, $D_B$ represents a diameter of the rolling element of the bearing, $D_P$ represents a diameter of a bearing section, $N_B$ represents the number of rolling elements in the bearing, and $\theta$ represents a contact angle.

With the device for diagnosing a fault in a bearing of a motor according to the first embodiment of the present disclosure, the fault diagnosis model unit 4 trains the bearing fault diagnosis model and performs pattern recognition by using a gradient boosting tree intelligent algorithm, which may alternatively be replaced by artificial intelligence algorithms such as a neural network, a random forest, and a support vector machine. The device for diagnosing a fault in a bearing of a motor according to the first embodiment may be well applied to offline or online health monitoring and fault early warning of the bearing of a traction motor in a locomotive.

Second Embodiment

Figure 3:
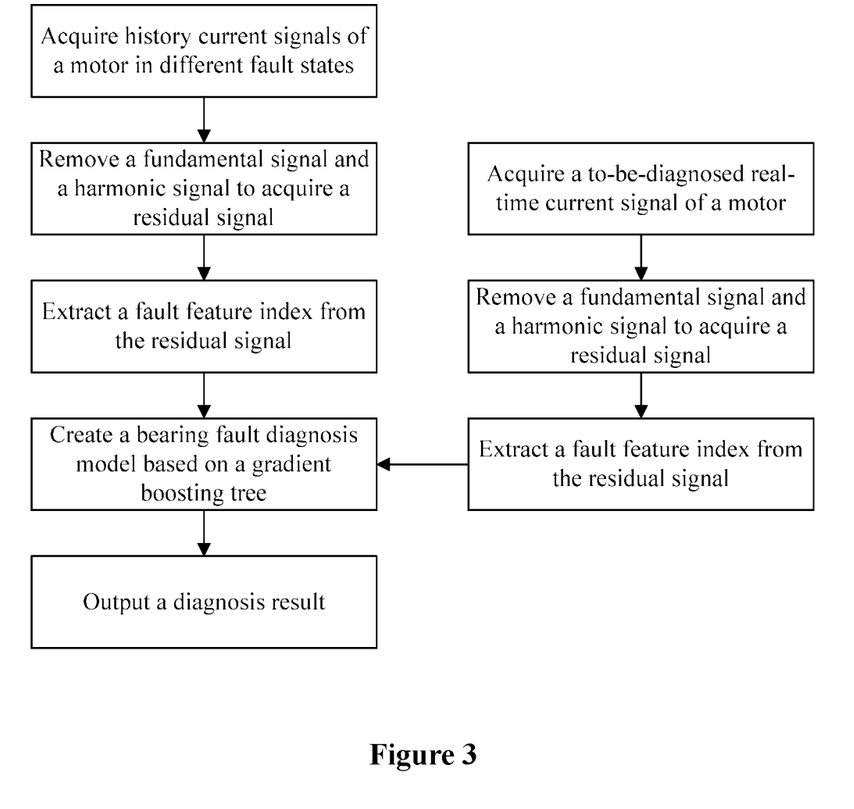
FIG. 3 is a flowchart of a method for diagnosing a fault in a bearing of a motor performed by the device according to the present disclosure.
Figure 4:
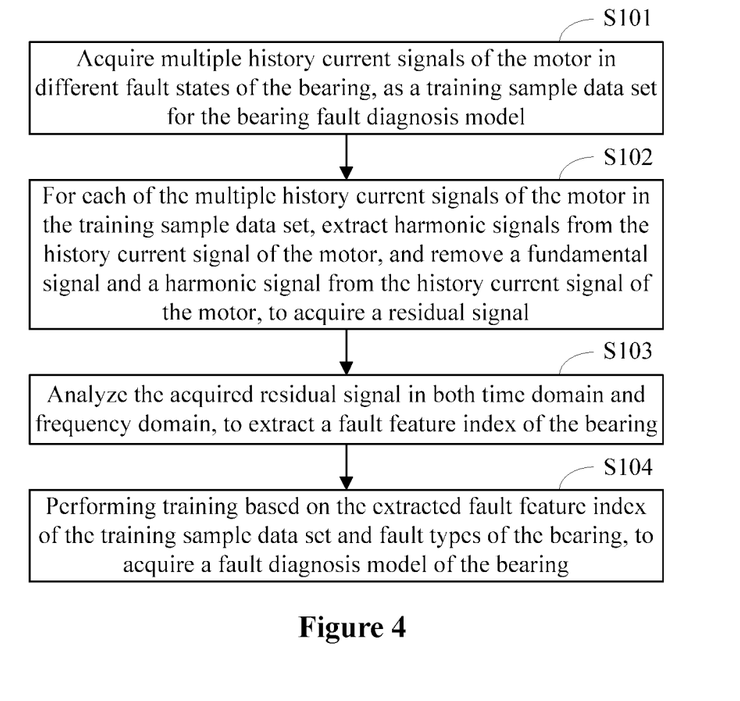
FIG. 4 is a flowchart showing a model training process in the method for diagnosing a fault in a bearing of a motor performed by the device according to the present disclosure.
Figure 5:
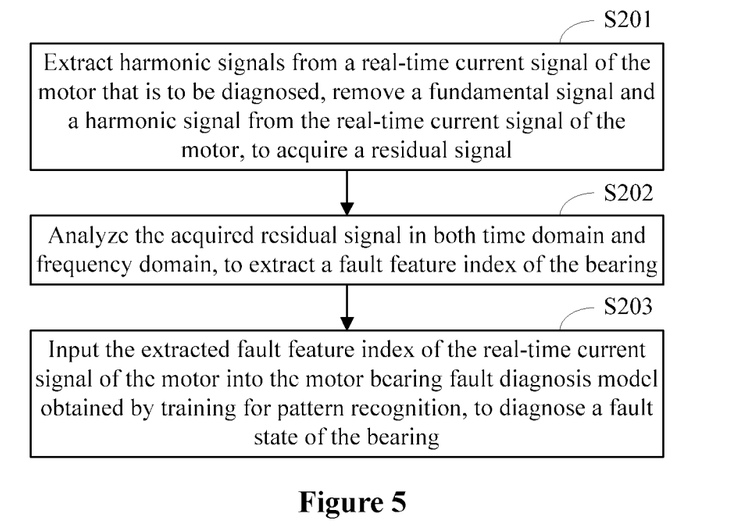
FIG. 5 is a flowchart showing a fault diagnosis process in the method for diagnosing a fault in a bearing of a motor performed by the device according to the present disclosure, in the drawings.

FIGS. 3 to 5 show embodiments of a method for diagnosing a fault in a bearing of a motor performed by the device according to the first embodiment according to the present disclosure. The method includes a model training process and a fault diagnosis process.

A) The model training process includes the following steps S101) to S104).

In S101), multiple history current signals of the motor in different fault states of the bearing are acquired, as a training sample data set of the bearing fault diagnosis model.

In S102), for each of the multiple history current signals of the motor in the training sample data set, harmonic signals are extracted from the history current signal of the motor, a fundamental signal and a harmonic signal are removed from the history current signal of the motor, to acquire a residual signal.

In S103), the residual signal acquired in step S102) is analyzed in both time domain and frequency domain, to extract a fault feature index of the bearing.

In S104), training is performed based on the fault feature index (vector) of the bearing extracted in step S103) and fault types of the bearing, to acquire a bearing fault diagnosis model.

B) The fault diagnosis process includes the following steps S201) to S203).

In S201), harmonic signals are extracted from a to-be-diagnosed real-time current signal of the motor, and a fundamental signal and a harmonic signal are removed from the real-time current signal of the motor, to acquire a residual signal.

In S202), the residual signal acquired in step S201) is analyzed in both time domain and frequency domain, to extract a fault feature index of the bearing.

In S203), the fault feature index (vector) of the bearing extracted in step S202) is inputted into the bearing fault diagnosis model obtained by training in step S104) for pattern recognition, to diagnose a fault state of the bearing.

The device for diagnosing a fault in a bearing of a motor according to the embodiment of the present disclosure has the following beneficial effects.

(1) With the device for diagnosing a fault in a bearing of a motor according to the embodiment of the present disclosure, the harmonic signals are extracted from the current signal of the motor, and the fundamental signal and the harmonic signal are removed from the history current signal of the motor, to acquire the residual signal, such that interference of a harmonic signal resulted from PWM power supply on the fault feature signal of the bearing can be effectively reduced, thereby improving a signal-to-noise ratio of the current signal. Therefore, the extracted fault feature index is significant.

(2) With the device for diagnosing a fault in a bearing of a motor according to the embodiment of the present disclosure, a change in the fault feature index of the bearing extracted from the residual signal reflects a change in a health state of the bearing of the traction motor. The fault feature index can accurately characterize a fault state of the bearing. The harmonic signal in the current signal is extracted and removed by using the full-phase time-shift phase difference correction algorithm, thereby further enhancing significance of the fault feature index.

(3) With the device for diagnosing a fault in a bearing of a motor according to the embodiment of the present disclosure, the fault state of the bearing can be automatically recognized by using the fault diagnosis model based on a gradient boosting tree. It is unnecessary for an expert to observe a spectrogram to diagnose the fault state of the bearing. Whether the bearing is faulty or not can be automatically recognized based on a feature of the current signal of the motor, thereby effectively reducing interference of a human subjective factor, and improving objectivity and accuracy of fault diagnosis.

The embodiments in this specification are described in a progressive way, each of which emphasizes the differences from others, and the same or similar parts among the embodiments can be referred to each other.

The above description shows only preferred embodiments of the present disclosure, and is not intended to limit the present disclosure in any form. Although the present disclosure is disclosed as above in the preferred embodiments, the present disclosure is not limited thereto. Those skilled in the art may make, based on the disclosed method and technical content, some variations and improvements to the technical solutions of the present disclosure, or make some equivalent embodiments without departing from the spirit and the scope of the technical solutions. Therefore, simple variants, equivalent changes and modifications made to the above embodiments from the technical essences of the present disclosure without departing from the technical solutions of the present disclosure should fall within the protection scope of the present disclosure.

The invention claimed is:

1. A device for diagnosing a fault in a bearing of a motor, comprising:
    a current signal acquisition unit, a residual signal acquisition unit, a fault feature extraction unit and a fault diagnosis model unit, wherein in a case that the device operates in a fault diagnosis mode,
    the current signal acquisition unit is configured to acquire a real-time current signal of the motor;
    the residual signal acquisition unit is configured to extract harmonic signals from the real-time current signal of the motor acquired by the current signal acquisition unit, and remove a fundamental signal and a harmonic signal from the real-time current signal of the motor, to acquire a residual signal;
    the fault feature extraction unit is configured to analyze the residual signal acquired by the residual signal acquisition unit in both time domain and frequency domain, to extract a fault feature index of the bearing; and
    the fault diagnosis model unit is configured to perform, by using a bearing fault diagnosis model obtained through training, pattern recognition on the fault feature index of the bearing extracted by the fault feature extraction unit, to diagnose a fault state of the bearing, wherein in the case that the device operates in the fault diagnosis mode, the fault feature extraction unit is configured to:
        acquire a minimum value (I_min) and an effective value (I_rms) of the residual signal,
        acquire a fault feature frequency of the bearing, and acquire a fault feature frequency sequence of the bearing, wherein FFT transformation is performed on the residual signal to acquire a frequency spectrum of the residual signal, and acquire an amplitude of the fault feature frequency sequence of the bearing based on the frequency spectrum of the residual signal; and
        acquire a maximum value ($I\_f\_max$), a peak-to-peak value ($I\_f\_peark$) and a crest factor ($I\_f\_crest$) of the amplitude ($I\_f(n)$) of the fault feature frequency sequence of the bearing.

2. The device for diagnosing a fault in a bearing of a motor according to claim 1, wherein in a case that the device operates in a fault model training mode,
    the current signal acquisition unit is configured to acquire a plurality of history current signals of the motor in different fault states of the bearing, as a training sample data set for the bearing fault diagnosis model;
    the residual signal acquisition unit is configured to, for each of the plurality of history current signals of the motor in the training sample data set acquired by the current signal acquisition unit, extract harmonic signals from the history current signal of the motor, and remove a fundamental signal and a harmonic signal from the history current signal of the motor, to acquire a residual signal;
    the fault feature extraction unit is configured to analyze the residual signal acquired by the residual signal acquisition unit in both time domain and frequency domain, to extract a fault feature index of the bearing; and
    the fault diagnosis model unit is configured to perform training based on the fault feature index of the bearing extracted by the fault feature extraction unit and fault types of the bearing, to acquire the bearing fault diagnosis model.

3. The device for diagnosing a fault in a bearing of a motor according to claim 2, wherein the residual signal acquisition unit is configured to:
    in a case that the device operates in the fault model training mode, for each of the plurality of history current signals, acquire amplitudes, initial phases and frequencies of the fundamental signal and the harmonic signal of the history current signal of the motor from the history current signal of the motor, to acquire the fundamental signal and the harmonic signal, and remove the fundamental signal and the harmonic signal from the history current signal of the motor, to acquire the residual signal; and
    in the case that the device operates in the fault diagnosis mode, acquire amplitudes, initial phases and frequencies of the fundamental signal and the harmonic signal of the real-time current signal of the motor that is to be diagnosed from the real-time current signal of the motor, to acquire the fundamental signal and the harmonic signal, and remove the fundamental signal and the harmonic signal from the real-time current signal of the motor to acquire the residual signal.

4. The device for diagnosing a fault in a bearing of a motor according to claim 3, wherein in the case that the device operates in the fault model training mode, the fault feature extraction unit is configured to:
    acquire a minimum value (I_min) and an effective value (I_rms) of the residual signal,
    acquire a fault feature frequency of the bearing, and acquire a fault feature frequency sequence of the bearing, wherein FFT transformation is performed on the residual signal to acquire a frequency spectrum of the residual signal, and acquire an amplitude of the fault feature frequency sequence of the bearing based on the frequency spectrum of the residual signal; and
    acquire a maximum value ($I\_f\_max$), a peak-to-peak value ($I\_f\_peark$) and a crest factor ($I\_f\_crest$) of the amplitude ($I\_f(n)$) of the fault feature frequency sequence of the bearing based on the amplitude of the fault feature frequency sequence of the bearing.

5. The device for diagnosing a fault in a bearing of a motor according to claim 3, wherein the residual signal acquisition unit is configured to:
    in the case that the device operates in the fault model training mode and for each of the plurality of history current signals, acquire amplitudes, initial phases and frequencies of the fundamental signal and the harmonic signal of the history current signal of the motor by using a full-phase time-shift phase difference correction algorithm, to acquire the fundamental signal and the harmonic signal; and
    in the case that the device operates in the fault diagnosis mode, acquire amplitudes, initial phases and frequencies of the fundamental signal and the harmonic signal of the real-time current signal of the motor by using a full-phase time-shift phase difference correction algorithm, to acquire the fundamental signal and the harmonic signal.

6. The device for diagnosing a fault in a bearing of a motor according to claim 5, wherein the fault diagnosis model unit is configured to:
    in the case that the device operates in the fault model training mode, performing training based on the extracted fault feature index of the bearing and fault types of the bearing by using a gradient boosting tree classifier, to acquire the bearing fault diagnosis model; and in the case that the device operates in the fault diagnosis mode, perform, by using the bearing fault diagnosis model based on a gradient boosting tree that is obtained by training, pattern recognition on the extracted fault feature index of the bearing, to diagnose the fault state of the bearing.

7. The device for diagnosing a fault in a bearing of a motor according to claim 2, wherein the fault feature frequency sequence $f(k)$ of the bearing is expressed as $|fe \pm kfv|$, k=1, 2, 3, wherein $fe$ represents a fundamental signal frequency of the residual signal, and $fv$ represents the fault feature frequency of the bearing.

8. The device for diagnosing a fault in a bearing of a motor according to claim 7, wherein the fault feature extraction unit is configured to:

acquire the minimum value (I_min) of the residual signal from following equation:

I_min=min(I(t)), wherein I(t) represents a time series of the residual signal, t=1~N, and N represents the number of sampling points of the residual signal;

acquire the effective value (I_rms) of the residual signal from following equation:

$$I\_rms = \sqrt{\frac{1}{N-1}\left(\sum_{t=1}^{N} I^2(t)\right)};$$

acquire the maximum value of the amplitude the fault feature frequency sequence of the bearing from following equation:

I_f _max=max(I_f (n)), wherein I_f (n) represents the amplitude of the fault feature frequency sequence of the bearing;

acquire the peak-to-peak value of the amplitude of the fault feature frequency sequence of the bearing from following equation: I_f _peark=I_f _max−I_min; and acquire the crest factor of the amplitude of the fault feature frequency sequence of the bearing from following equation:

I_f _crest=I_f max/I_rms

9. The device for diagnosing a fault in a bearing of a motor according to claim 1, wherein the fault state of the bearing comprises a fault in a holder of the bearing, a fault in an outer ring of the bearing, a fault in an inner ring of the bearing and a fault in a rolling element of the bearing, and the fault feature extraction unit is configured to:

acquire a fault feature frequency of the holder of the bearing from following equation:

$$\frac{1}{2}f_r\left(1 - \frac{D_B\cos\theta}{D_P}\right);$$

acquire a fault feature frequency of the outer ring of the bearing from following equation:

$$\frac{N_B}{2}f_r\left(1 - \frac{D_B\cos\theta}{D_P}\right);$$

acquire a of a fault feature frequency of the inner ring of the bearing from following equation:

$$\frac{N_B}{2}f_r\left(1 + \frac{D_B\cos\theta}{D_P}\right); \text{ and}$$

acquire a fault feature frequency of the rolling element of the bearing from following equation:

$$\frac{D_P}{D_B}f_r\left(1 - \left(\frac{D_B\cos\theta}{D_P}\right)^2\right),$$

wherein $fr$ represents a rotation frequency of the motor, $D_B$ represents a diameter of the rolling element of the bearing, $D_P$ represents a diameter of a bearing section, $N_B$ the number of rolling elements in the bearing, and $\theta$ represents a contact angle.

* * * * *